(12) United States Patent
Ueda

(10) Patent No.: US 7,501,853 B2
(45) Date of Patent: Mar. 10, 2009

(54) DATA PROCESSING CIRCUIT

(75) Inventor: Kazuhiro Ueda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 28 days.

(21) Appl. No.: 11/727,270

(22) Filed: Mar. 26, 2007

(65) Prior Publication Data

US 2007/0273407 A1    Nov. 29, 2007

(30) Foreign Application Priority Data

Apr. 20, 2006   (JP) .............................. 2006-116842

(51) Int. Cl.
  *H03F 3/45* (2006.01)
  *H03K 17/16* (2006.01)
(52) U.S. Cl. .............................. 326/33; 326/86; 327/333
(58) Field of Classification Search .................. None
  See application file for complete search history.

(56) References Cited

U.S. PATENT DOCUMENTS

| 2005/0024084 A1 | 2/2005 | Hirata et al. | |
| 2005/0179485 A1* | 8/2005 | Iwase | 327/541 |
| 2005/0184805 A1* | 8/2005 | Murakami | 330/261 |
| 2006/0232326 A1* | 10/2006 | Seitz et al. | 327/539 |
| 2007/0146010 A1* | 6/2007 | Isobe | 326/83 |
| 2008/0136460 A1* | 6/2008 | Fujiwara et al. | 327/77 |

FOREIGN PATENT DOCUMENTS

JP      2005-64455 A      3/2005

* cited by examiner

*Primary Examiner*—Rexford Barnie
*Assistant Examiner*—Dylan White
(74) *Attorney, Agent, or Firm*—Miles & Stockbridge P.C.

(57) ABSTRACT

A semiconductor device includes a resistive element having a resistance characteristic not influenced by fluctuations in power supply voltage and a signal output circuit having a desired output impedance characteristic not influenced by fluctuations in power supply voltage. A constant current based on a reference voltage corresponding to a ground potential point is generated, and passed to a first resistive element whose one end is connected to a power supply voltage terminal. A voltage generated by the first resistive element is supplied to a first differential amplifier, whose output voltage is supplied to the gate of a first MOSFET whose source is connected to the power supply voltage terminal. A drain voltage to the first MOSFET is fed back to the first differential amplifier. A first current source is between the drain of the first MOSFET and the ground potential point. A second MOSFET is used as a resistive element.

26 Claims, 9 Drawing Sheets

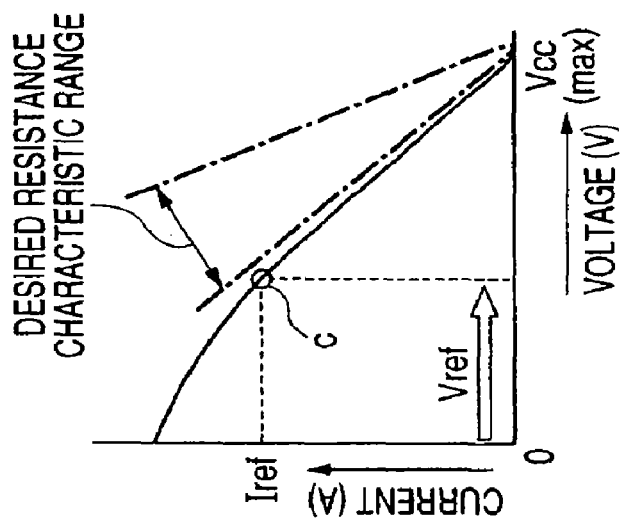
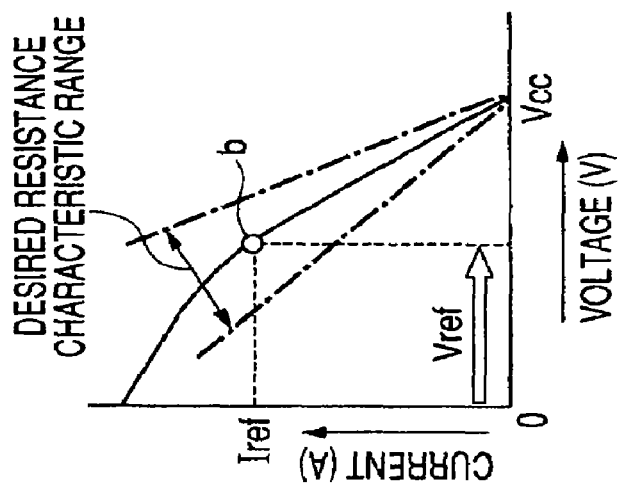
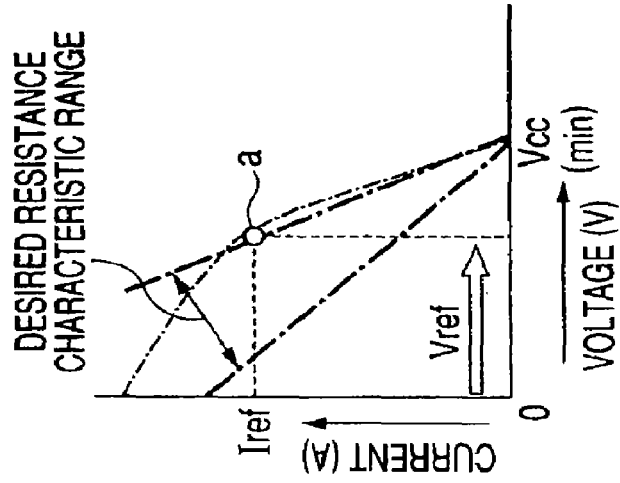

DATA PROCESSING CIRCUIT

CROSS-REFERENCE TO RELATED APPLICATIONS

The disclosure of Japanese Patent Application No. 2006-116842 filed on Apr. 20, 2006 including the specification, drawings, and abstract is incorporated herein by reference in its entirety.

BACKGROUND OF THE INVENTION

The present invention relates to a semiconductor device and, more particularly, to a technique effectively used for a semiconductor device having a transmission/reception circuit of the USB (Universal Serial Bus) 2.0 standard as an interface of a personal computer.

In a signal transmission/reception system, in the case of connecting the transmission side and the reception side via a transmission path, a termination resistor is connected to each of a transmission end and a reception end of the transmission path; and the resistance value of the termination resistors is set to a value according to the characteristic impedance of the transmission path to reduce the reflection effect at the transmission end and the reception end of a signal, thereby increasing the signal quality and the waveform quality. As the communication speed increases, it is desired to set the values of the termination resistors at the transmission and reception ends of signals more accurately and reduce the signal reflection effect. However, in the configuration of externally attaching the termination resistors at the transmission and reception ends of a transmission path, a transmission path of a certain distance exists from a transmission circuit to the mounting position of the transmission-side termination resistor and from the mounting position of the reception-side termination resistor to the reception circuit. Consequently, parasitic capacitance exists during transmission of a signal from the transmission circuit to the position of the transmission-side termination resistor and from the position of the reception-side termination resistor to the reception circuit, and there is a problem that the waveform quality deteriorates in the reception circuit. The configuration of externally attaching the termination resistors at the transmission and reception ends of the transmission path has a drawback of high manufacturing cost, and realization of integration of the termination resistors in an LSI is demanded.

Hitherto, to realize integration of termination resistors in a semiconductor LSI, for example, in the case of constructing the termination resistors only by built-in polysilicon resistive elements and diffusion resistive elements (which are manufactured simultaneously with a number of transistor elements and the like to be provided in the semiconductor LSI in the same manufacture process), the characteristics largely vary depending on the manufacture process, ambient temperature, application voltage, and the like, and desired termination resistor characteristics are not obtained. Japanese Unexamined Patent Application Publication No. 2005-64455 (semiconductor integrated circuit and signal transmission/reception system) proposes a system of a termination resistor having a circuit for adjusting gate bias of a MOS of a termination resistor or a MOS as a part of a termination resistor.

FIG. 12 shows a circuit corresponding to Japanese Unexamined Patent Application Publication No. 2005-64455. One end of a polysilicon resistive element R21 as a part of a termination resistor is connected to a power supply voltage terminal Vcc. The source node of a P-channel MOSFET QP11 as a part of the termination resistor is connected to the power supply voltage terminal Vcc. A control voltage generated by a gate bias voltage adjustment circuit is supplied to the gate of the P-channel MOSFET QP11. The gate bias voltage adjustment circuit adjusts the gate bias voltage of the P-channel MOSFET QP11 to adjust the resistance value of the P-channel MOSFET QP11. By controlling the resistance value of the P-channel MOSFET QP11, the value of the termination resistor constructed by the P-channel MOSFET QP11 and the resistive element R21 is controlled. A constant current source Iref passes a constant current Iref from the ground potential of the circuit via a parallel circuit of a polysilicon resistive element R20 and a P-channel MOSFET QP10 to the ground potential of the circuit. A reference voltage Vref is supplied to the inversion input (−) of a differential amplifier AMP and the voltage of the drain node of the P-channel MOSFET QP10 is fed back to the non-inversion input (+) of the differential amplifier AMP. The output node of the differential amplifier AMP is connected to the gate node of the P-channel MOSFET Q10 to feedback control the gate bias voltage of the P-channel MOSFET QP10 so that a voltage drop amount which occurs in the MOSFET QP10 and the resistive element R20 as a replica circuit becomes equal to the reference voltage Vref. Since the output node of the gate bias voltage adjustment circuit is also connected to the gate of the P-channel MOSFET QP11 as a part of the termination resistor, a combined resistance value between the power supply voltage terminal Vcc and a node n1 of an LSI pad to which a cable is connected also becomes the same expectation value as that set in the replica circuit. With such a configuration, the resistance value of the built-in termination resistor can be automatically adjusted to an expectation value.

SUMMARY OF THE INVENTION

FIGS. 13A, 13B, and 13C show resistance characteristics of the terminal resistor of the circuit of FIG. 12. The reference voltage Vref and the reference current Iref are supplied from a constant voltage/current circuit such as a band gap reference circuit, and are always constant independently of the power supply voltage Vcc of the transmission/reception circuit and the power supply voltage Vcc in the LSI. Therefore, the DC resistance characteristic of a pull-up termination resistive element becomes a curve passing through operation points a, b, and c specified by the reference voltage Vref using 0V as a reference and the reference current Iref as shown in FIGS. 13A, 13B, and 13C. As shown in FIG. 13B, when the power supply voltage Vcc is a specific voltage, the characteristic in a desired resistance characteristic range is realized. In other words, the reference voltage Vref and the reference current Iref are generated so as to obtain the desired resistance characteristic at the specific power supply voltage Vcc. However, in the case where the power supply voltage Vcc is the standard minimum value Vcc(min) as shown in FIG. 12A, the desired resistance characteristic range shifts to the left (toward 0V) in correspondence with the standard minimum value Vcc(min), and the DC resistance characteristic of the pull-up termination resistive element operating in correspondence with the reference voltage Vref and the reference current Iref which are constant irrespective of the standard minimum value Vcc (min) deviates from the desired resistance characteristic range. In the case where the power supply voltage Vcc is the standard maximum value Vcc(max) as shown in FIG. 13C, the desired resistance characteristic range shifts to the right (toward Vcc) in correspondence with the standard maximum value Vcc(max), and the DC resistance characteristic of the pull-up termination resistive element operating in correspondence with the reference voltage Vref and the reference current Iref which are constant irrespective of the standard maximum value Vcc(max) deviates from the desired resistance characteristic range.

An object of the present invention is to provide a semiconductor device including a resistive element having a resistance characteristic which is not influenced by fluctuations in the power supply voltage. Another object of the invention is to provide a semiconductor device including a signal output circuit having a desired output impedance characteristic which is not influenced by fluctuations in the power supply voltage. The above and other objects and novel features of the present invention will become apparent from the description of the specification and the appended drawings.

An outline of representative one of inventions disclosed in the application will be briefly described as follows. A constant current based on a reference voltage corresponding to a ground potential point of a circuit is generated. The constant current is passed to a first resistive element whose one end is connected to a power supply voltage terminal. A voltage generated by the first resistive element is supplied to a first differential amplifier, and the output voltage is supplied to the gate of a first MOSFET of a first conduction type whose source is connected to the power supply voltage terminal. A drain voltage to the first MOSFET is fed back to the other input terminal of the first differential amplifier. A first current source is provided between the drain of the first MOSFET and the ground potential point of the circuit. A second MOSFET of the first conduction type whose source is connected to the power supply voltage terminal, and whose gate and the gate of the first MOSFET are commonly connected is used as a resistive element.

Thus, a resistive element having a DC resistance characteristic which does not depend on fluctuations of power supply voltage can be realized.

BRIEF DESCRIPTION OF THE DRAWINGS

FIGS. 13A, 13B, and 13C are characteristic diagrams of the pull-up resistor of FIG. 12.

DETAILED DESCRIPTION OF THE PREFERRED EMBODIMENTS

Figure 1:
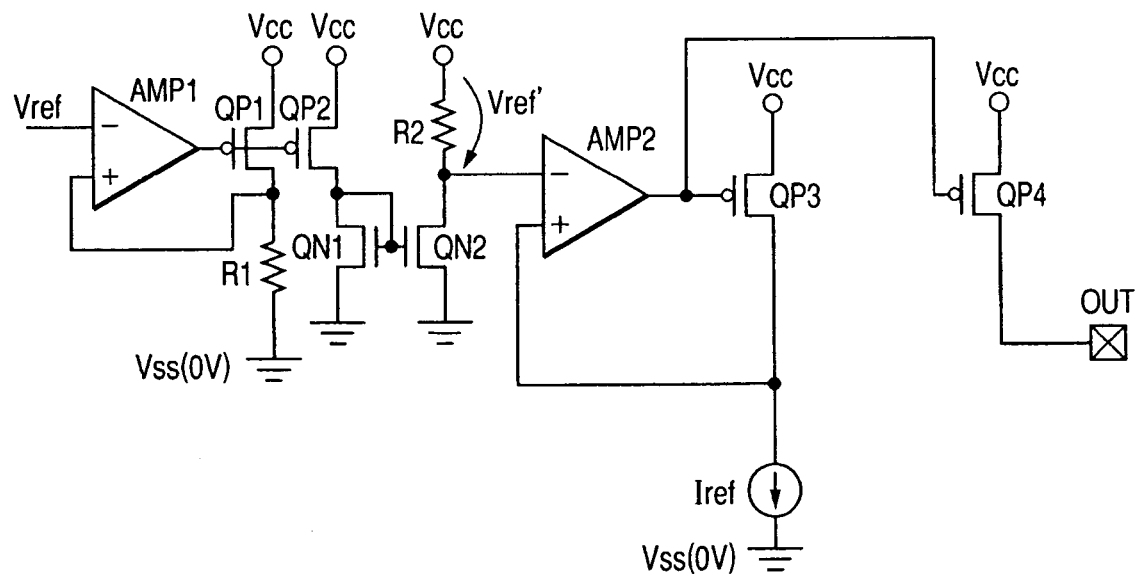
FIG. 1 is a circuit diagram showing an example of a pull-up resistor provided for a semiconductor device according to the invention.

FIG. 1 is a circuit diagram showing an example of a pull-up resistor provided for a semiconductor device according to the present invention. A reference voltage Vref is supplied to the inversion input terminal (−) of a differential amplifier AMP1. An output voltage of the differential amplifier AMP1 is supplied to the gates of P-channel MOSFETs QP1 and QP2. The sources of the P-channel MOSFETs QP1 and QP2 are connected to the power supply voltage terminal Vcc. The drain voltage of the MOSFET QP1 is fed back to the non-inversion input terminal (+) of the differential amplifier AMP1. A resistor R1 is provided between the drain of the MOSFET QP1 and the ground potential point Vss (0V).

Between the drain of the P-channel MOSFET QP2 and the ground potential point Vss (0V) of the circuit, an N-channel MOSFET QN1 whose gate and drain are connected is provided. The MOSFET QN1 and an N-channel MOSFET QN2 are connected in a current mirror form. A resistor R2 is provided between the drain of the MOSFET QN2 and the power supply voltage terminal Vcc. The resistors R1 and R2 are formed in the same manufacturing process and disposed as close as possible. Although not limited, the resistors R1 and R2 are formed by polysilicon resistors and are set to have the same resistance value.

The reference voltage Vref is a constant voltage using the ground potential (0V) of the circuit as a reference. In the case where the size ratios of the MOSFETs QP1 and QP2 are set to the same and the size ratios of the MOSFETs QN1 and QN2 are set to the same, by equalizing the resistance values of the resistors R1 and R2 as described above, a constant voltage Vref' using the power supply voltage Vcc as a reference can be obtained by the resistor R2. Specifically, in the resistor R1, a current such as Vref/R1 flows in the MOSFET QP1 and the same current flows in the P-channel MOSFET QP2. The same current flows in the resistor R2 via the current mirror circuit (QN1 and QN2). Therefore, by making the resistance value of the resistor R2 equal to the resistance value of the resistor R1, the equal current can be passed to the resistors R1 and R2. Thus, the voltage Vref applied to the resistor R1 becomes equal to the voltage Vref' generated at the resistor R2.

The circuit converts the reference voltage Vref using the ground potential Vss of the circuit as a reference to the reference voltage Vref' using the power supply voltage Vcc as a reference. For example, to reduce current consumption, it is also possible to decrease the size ratio of the MOSFET QP2 to the MOSFET QP1 (or the size ratio of QN2 to QN1) to 1/N and set the resistance value of the resistor R2 to N times as large as the resistance value of the resistor R1, thereby equalizing the voltages across the resistors R1 and R2 to each other like Vref=Vref'.

The reference voltage Vref' is supplied to the inversion input terminal (−) of a differential amplifier AMP2. An output voltage of the differential amplifier AMP2 is supplied to the gates of P-channel MOSFETs QP3 and QP4. The sources of the MOSFETs QP3 and QP4 are connected to the power supply voltage terminal Vcc. A constant current source Iref is provided between the drain of the MOSFET QP3 and the ground potential point Vss (0V) of the circuit. The drain voltage of the MOSFET QP3 is fed back to the non-inversion input terminal (+) of the differential amplifier AMP2. The MOSFET QP3 and the constant current source Iref form a replica circuit of the MOSFET QP4 operating as a pull-up resistor. To the gate of the MOSFET QP3, a control voltage corresponding to the reference voltage Vref' and passing the constant current Iref is supplied. Therefore, the MOSFET QP4 operating as the pull-up resistor is controlled to have a resistance characteristic similar to that of the MOSFET QP3.

The reference voltage Vref' is input to the inversion input terminal (−) of the differential amplifier AMP2, and the voltage of the drain node of the P-channel MOSFET QP3 as a replica circuit is fed back to the non-inversion input terminal (+). The output voltage of the differential amplifier AMP2 is supplied to the gate of the P-channel MOSFET QP3 as a replica circuit and the gate of the P-channel MOSFET QP4 as a pull-up resistor. The gate bias voltage of the P-channel MOSFET QP3 is feedback-controlled so that the voltage drop amount which occurred in the MOSFET QP3 of the replica circuit becomes equal to the reference voltage Vref'. Since the output voltage of the differential amplifier AMP2 is also supplied to the gate of the P-channel MOSFET QP4 as a part of the pull-up resistor, a combined resistance value between the power supply voltage terminal Vcc and an LSI pad corresponding to an output terminal OUT becomes the same expectation value as that set in the replica circuit. With such a configuration, the resistance value of the built-in pull-up resistor can be automatically adjusted to an expectation value.

The reference voltage Vref and the constant current Iref are generated by a constant voltage/current circuit or the like such as a band gap reference circuit as will be described later, and are always constant without depending on the power supply voltage Vcc of the semiconductor device. The reference voltage Vref is supplied from the band gap reference circuit and has a constant voltage value using the ground potential point Vss (0V) of the circuit as a reference, and is converted to a reference voltage Vref' using the power supply voltage Vcc as a reference by the circuit. The resistors R1 and R2 are elements formed by the same process as that of other MOS elements in the semiconductor device LSI and largely vary in a semiconductor manufacturing process. However, the degrees of variations in the resistors R1 and R2 are similar to each other, so that the ratio between the resistors R1 and R2 is always maintained constant. The resistors R1 and R2 are disposed close to each other in the layout so that the ratio between the resistors R1 and R2 is maintained. In such a manner, the MOSFET QP4 is allowed to operate so as to have a desired resistance characteristic without being influenced by fluctuations in the power supply voltage. Vcc.

Figure 2:
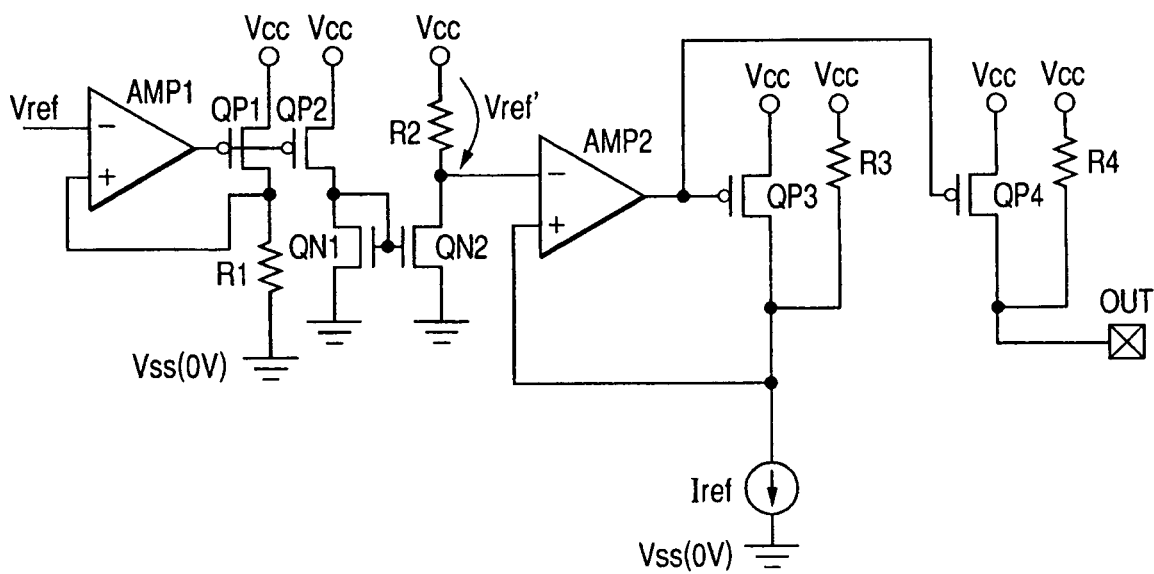
FIG. 2 is a circuit diagram showing another example of the pull-up resistor provided for the semiconductor device according to the invention.

FIG. 2 is a circuit diagram showing another embodiment of a pull-up resistor provided for the semiconductor device according to the invention. In the embodiment, resistors R3 and R4 are connected in parallel with the P-channel MOSFET QP3 of the replica circuit and the P-channel MOSFET QP4 operating as a pull-up resistor, respectively. By connecting the resistors R3 and R4 in parallel, the operating range can be also widened as compared with the case where the pull-up resistor is formed only by the MOSFET QP4 and operates only in a linear region of the MOSFET as in the embodiment of FIG. 1. By providing built-in resistors in parallel, an excellent frequency characteristic is obtained and the operating range can be also widened.

Figure 3A:
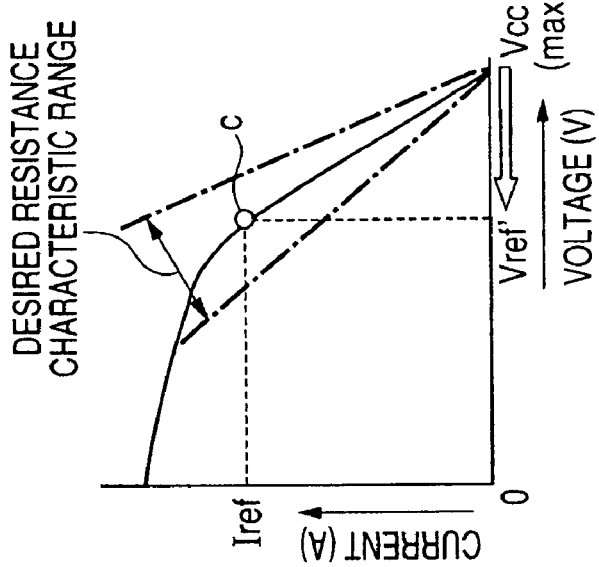
FIGS. 3A, 3B, and 3C are characteristic diagrams of the pull-up resistor provided for the semiconductor device according to the invention.
Figure 3B:
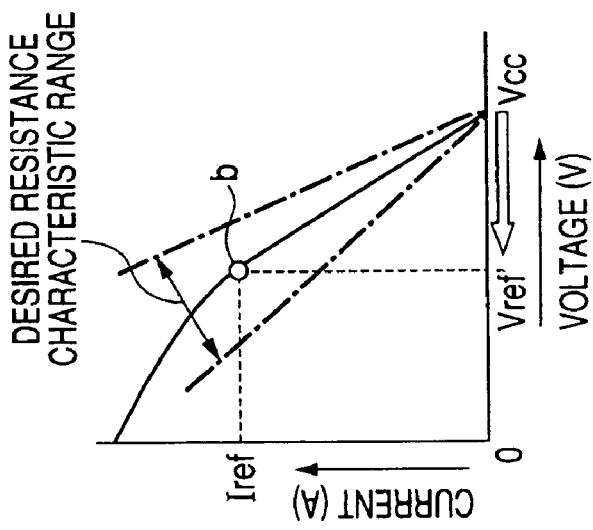
Figure 3C:
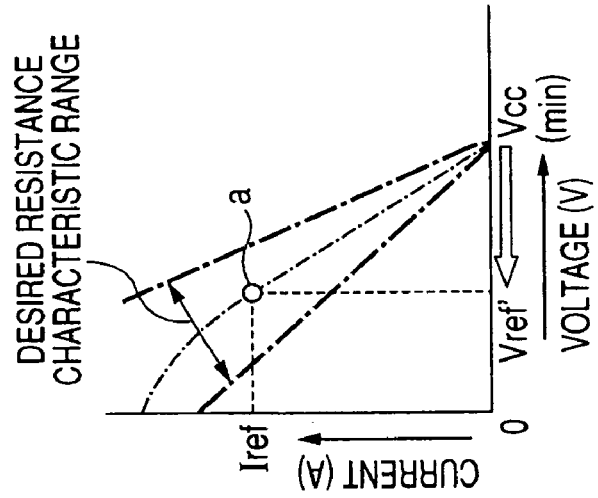

FIGS. 3A to 3C show characteristic diagrams of the pull-up resistor provided for the semiconductor device according to the present invention. The DC resistance characteristic of the pull-up resistor is expressed by curves passing through operation points a, b, and c specified by the reference voltages Vref' and Iref using the power supply voltage Vcc as a reference as shown in FIGS. 3A, 3B, and 3C. As shown in FIG. 3A, when the power supply voltage Vcc is the standard minimum value Vcc(min), the desired resistance characteristic range shifts to the left side (toward 0V) in correspondence with the standard minimum value Vcc(min). In the embodiment, the reference voltage Vref' using the power supply voltage Vcc as a reference is used, the operation point "a" also shifts to the left side in correspondence with the standard minimum value Vcc (min) so that the DC resistance characteristic of the pull-up resistor lies in the desired resistance characteristic range. On the contrary, as shown in FIG. 3C, when the power supply voltage Vcc is the standard maximum value Vcc(max), the desired resistance characteristic range shifts to the right side (toward Vcc) in correspondence with the standard maximum value Vcc(max). Similarly, since the reference voltage Vref' using the power supply voltage Vcc as a reference is used, the operation point "c" also shifts to the right side in correspondence with the standard minimum value Vcc(min) so that the DC resistance characteristic of the pull-up resistor lies in the desired resistance characteristic range. In FIG. 3B, obviously, since the power supply voltage Vcc is specified voltage, the characteristic in the desired resistance characteristic range can be realized.

Figure 4:
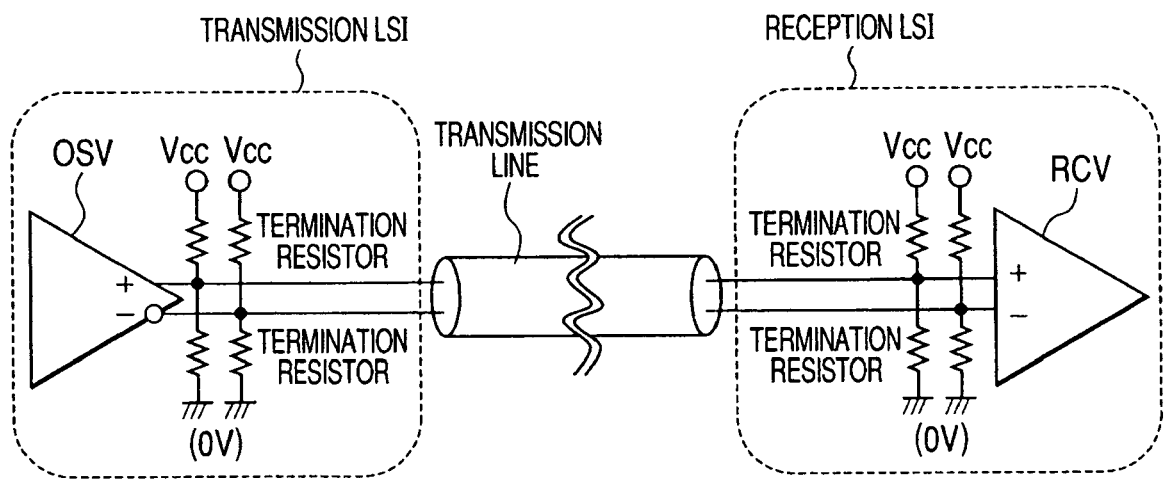
FIG. 4 is a general configuration diagram of a signal transmission/reception system to which the present invention is applied.

FIG. 4 is a diagram showing a general configuration of a signal transmission/reception system to which the present invention is applied. In the diagram, the signal transmission/reception system includes a transmission LSI, a reception LSI, and a transmission line made by a differential cable, a line formed on a printed board, or the like. A transmission signal is transmitted from a transmission circuit OSV of the transmission LSI to the transmission line, and is received by a receiver RCV in the reception LSI. In the transmission LSI, after the transmission circuit OSV, built-in termination resistors are disposed for two signal lines constructing the differential cable of the transmission line. In the reception LSI, before the receiver RCV, built-in termination resistors are disposed for two signal lines constructing the differential cable of the transmission line. Termination resistors may exist for all of the two signal lines constructing the transmission line, or a transmission/reception system which does not have any of the termination resistors may be employed. The pull-up termination resistor provided on the power supply voltage Vcc side among the built-in termination resistors is constructed by the circuit as shown in FIGS. 1 and 2. The termination resistor provided on the ground potential 0V side of the circuit is constructed by a circuit using a MOSFET as will be described later.

Figure 5:
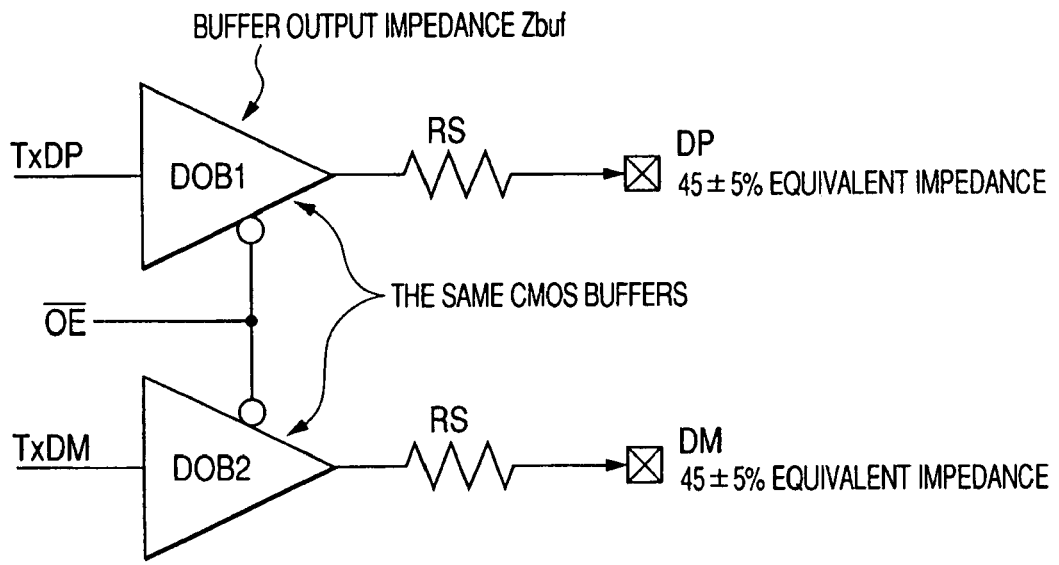
FIG. 5 is a block diagram showing an example of a transmission circuit provided for the semiconductor device according to the invention.

FIG. 5 is a block diagram showing an embodiment of a transmission circuit provided for the semiconductor device according to the invention. The transmission circuit of the embodiment is conformed with the USB (Universal Serial Bus) 2.0 standard as an interface of a personal computer. The transmission circuit has an output buffer circuit DOB1 corresponding to a positive-phase transmission signal TxDP and an output buffer circuit DOB2 corresponding to a negative-phase transmission signal TxDM. The operation of the two output buffer circuits DOB1 and DOB2 is controlled by an output enable signal /OE. For example, when the signal /OE is at the low level, the output buffer circuits DOB1 and DOB2 are made operative, a positive-phase signal corresponding to the positive-phase transmission signal TxDP is output from an output terminal DP, and a negative-phase signal corresponding to the negative-phase transmission signal TxDM is output from an output terminal DM. When the signal /OE is at the high level, the output buffer circuits DOB1 and DOB2 enter an output high-impedance state, and receiving operation from the terminals DP and DM is enabled. Also when the signal transmitting operation is not performed, the signal /OE is set to the high level, and the output buffer circuits DOB1 and DOB2 enter the output high-impedance state.

An output impedance Zbuf of the output buffer circuits DOB1 and DOB2 has 45+5% (Ω) when viewed from the output terminal DP. Series resistors RS are provided when a series damping resistor is internally provided. The series resistors RS are included in buffer impedance requirements, and the relation of the resistance RS+Zbuf=45+5% (Ω) is satisfied. When impedance viewed from the output terminal DP is ZR and the transmission path characteristic impedance is Z, in the case where a resistance value ZR is not equal to the characteristic impedance Z, a signal propagating through the transmission line is reflected at the reception terminal at a reflection coefficient Γ shown by the following equation (1). Consequently, it is important to set the impedance ZR to 45+5% (Ω).

$$\Gamma=(ZR-Z)/(ZR+Z) \quad (1)$$

Figure 6:
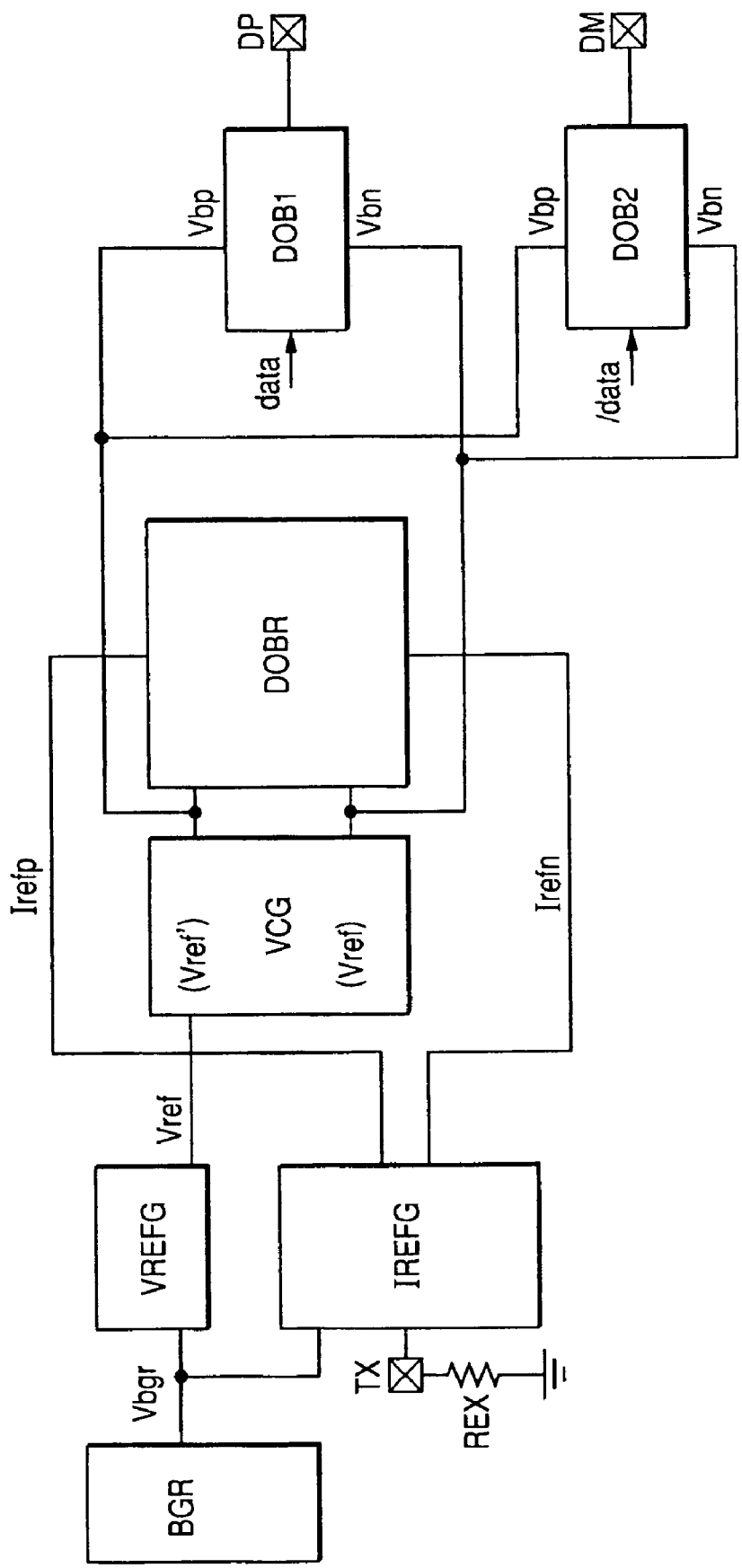
FIG. 6 is a block diagram showing a concrete example of the transmission circuit of FIG. 5.

FIG. 6 is a block diagram showing a concrete example of the transmission circuit of FIG. 5. In the example, the transmission circuit is constructed by the output buffer circuits DOB1 and DOB2 and a control circuit for controlling an output impedance. The control circuit includes a band gap reference circuit BGR, a reference voltage generation circuit VREFG, a control voltage generation circuit VCG, and an output buffer replica circuit DQBR. An input signal "data" of the output buffer DOB1 corresponds to the transmission signal TxDP in FIG. 5. An input signal "/data" of the output buffer DOB2 corresponds to the transmission signal TxDM in FIG. 5.

The band gap reference circuit BGR generates a constant voltage Vbgr on a silicon band gap. Since the band gap constant voltage Vbgr is a voltage of about 1.1V using the ground potential Vss(0V) of the circuit as a reference, it is amplified to the reference voltage Vref such as 1.65V suitable for output impedance control by the reference voltage generation circuit VREFG. A reference current generation circuit IREFG supplies the constant voltage Vbgr to a high-precision external resistor REX connected to an external terminal TX and generates control signals Irefn and Irefp for generating constant current. The control signal Irefn is a control signal for a constant power supply constructed by an N-channel MOSFET, and the control signal Irefp is a control signal for a constant power supply constructed by a P-channel MOSFET.

The reference voltage Vref is supplied to the control voltage generation circuit VCG. The control voltage generation circuit VCG generates the reference voltage Vref' using the power supply voltage Vcc as a reference by the voltage converting circuit as shown in FIGS. 1 and 2 from the reference voltage Vref. The control voltage generation circuit VCG uses the two reference voltages Vref and Vref' and the output buffer replica circuit DOBR and generates a control voltage Vbp for controlling the output impedance of the output buffer circuit DOB1 and a control voltage Vbn for controlling the output impedance of the output buffer circuit DOB2.

Figure 7:
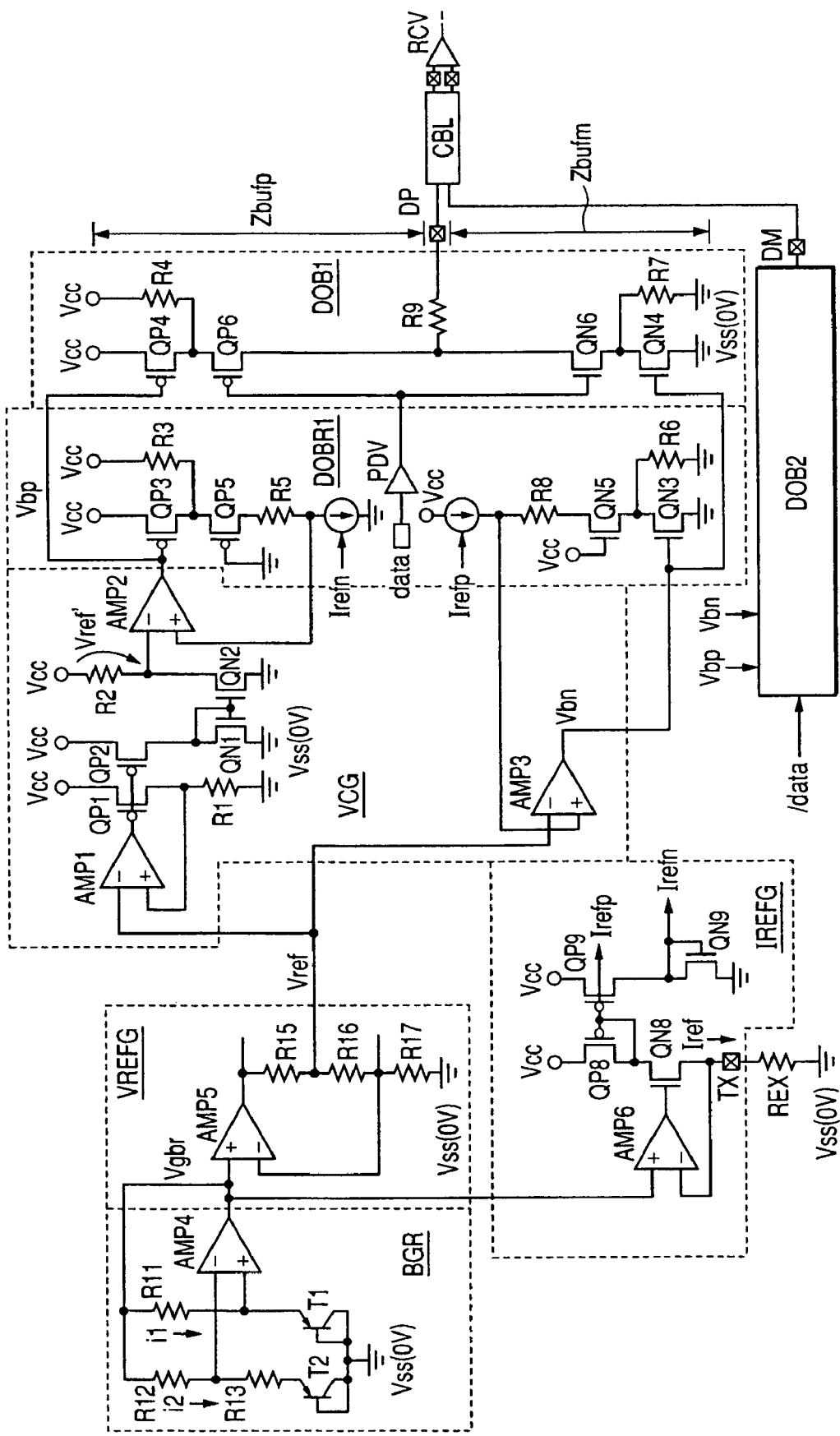
FIG. 7 is a concrete circuit diagram showing an example of he transmission circuit of FIG. 6.

FIG. 7 is a concrete circuit diagram showing an example of the transmission circuit of FIG. 6. The circuit diagram shows the output buffer circuit DOB1 as one of the circuits in a full speed mode in the USB 2.0 standard. The other output buffer circuit DOB2 is shown as a black box. In the full speed mode, data transfer at 12 Mbps can be performed.

In the band gap reference circuit BGR, PNP transistors T1 and T2 connected in a diode form are used. The base and collector of the transistors T1 and T2 are connected to the ground potential point Vss (0V) of the circuit. The size of the transistor T1 is smaller than that of the transistor T2. One end of a resistor R13 is connected to the emitter of the transistor T2. The other end of the resistor R13 and the emitter of the transistor T1 are connected to the inversion input terminal (−) and the non-inversion input terminal (+) of a differential amplifier AMP4, respectively. Resistors R12 and R11 are provided between the output terminal of the differential amplifier AMP4 and the inversion input terminal (−) and the non-inversion input terminal (+) of the differential amplifier AMP4.

The differential amplifier AMP4 generates an output voltage so that the potential difference between the input terminals (+) and (−) becomes zero. By equalizing the resistance values of the resistors R11 and R12, the values of currents i1 and i2 become the same. Therefore, the current density of the transistor T1 and that of the transistor T2 are different from each other in correspondence with the emitter size ratio. The current density of the emitter of the transistor T1 having smaller size is higher than that of the emitter of the transistor T2 having larger size. Consequently, base-emitter voltage Vbe1 of the transistor T1 is higher than base-emitter voltage Vbe2 of the transistor T2. The differential voltage ΔV (=Vbe1−Vbe2) corresponding to the silicon band gap is applied across the resistor R13, and the current i2 becomes constant current. Since the resistance values of the resistors R11 and R12 are equalized, the current i1 is similarly constant. The ratio between the resistors R13 and R12 is set to a predetermined ratio, and the negative temperature characteristic of the differential voltage ΔV is compensated. The output voltage Vgbr obtained from the output terminal of the differential amplifier AMP4 becomes constant voltage corresponding to the silicon band gap of about 1.1V.

The reference voltage generation circuit VREFG is a negative feedback amplifier including a differential amplifier AMP5 and resistors R15 and R16. By the resistance ratio of the resistors R15 and R16, the reference voltage Vref such as 1.65V is generated.

The reference current generation circuit IREFG generates the reference current Iref by a differential amplifier AMP6, an N-channel MOSFET QN8, and the resistor REX provided on the outside of the semiconductor device via the external terminal TX. Specifically, the band gap constant voltage Vgbr is supplied to the non-inversion input terminal (+) of the differential amplifier AMP6. An output voltage of the differential amplifier AMP6 is supplied to the gate of the N-channel MOSFET QN8. The source voltage of the MOSFET QN8 is supplied to the resistor REX via the external terminal TX and is fed back to the inversion input terminal (−) of the differential amplifier AMP6. The differential amplifier AMP6 generates an output voltage so that the potentials at the input terminals (+) and (−) become the same, and operates the MOSFET QN8. Consequently, to the external resistor REX, the constant voltage corresponding to the silicon band gap is applied. The constant current Iref is generated and flows in the MOSFET QN8. By using the reference voltage Vgbr and the external resistor REX, the stable desired reference current Iref can be generated without being influenced by fluctuations in the power supply voltage, temperature change, and process variations.

Between the drain of the MOSFET QN8 and the power supply voltage terminal Vcc, a diode-form P-channel MOSFET QP8 is provided. A P-channel MOSFET QP9 is provided so as to form a current mirror circuit in cooperation with the MOSFET QP8. A diode-form N-channel MOSFET QN9 is provided between the MOSFET QP9 and the ground potential point Vss of the circuit. The control signal Irefp generated so as to pass the constant current Iref to the P-channel MOSFET QP8 is used as an input signal of a current source formed by a P-channel MOSFET provided for the output buffer replica circuit DOBR which will be described later. The control signal Irefn generated so as to pass the constant current Iref to the N-channel MOSFET QP9 is used as an input signal of a current source formed by an N-channel MOSFET provided for the output buffer replica circuit DOBR which will be described later.

The control voltage generation circuit VCG includes the differential amplifier AMP1, the resistors R1 and R2, and the MOSFETs QP1, QP2, QN1, and QN2 as shown in FIGS. 1 and 2 and converts the reference voltage Vref using the ground potential Vss of the circuit as a reference and generated by the reference voltage generation circuit VREFG to the reference voltage Vref' using the power supply voltage Vcc as a reference. The reference voltage Vref' is used to control a pull-up resistor in cooperation with the differential amplifier AMP2 and the output buffer replica circuit. The reference voltage Vref is used to control a pull-down resistor in cooperation with the differential amplifier AMP3 and the output buffer replica circuit.

In the output buffer circuit DOB1, a P-channel output MOSFET QP6 is provided between the P-channel MOSFET QP4 operating as a pull-up resistor similar to that of FIG. 2 and the output terminal DP. An N-channel MOSFET QN6 is also provided between the N-channel MOSFET QN4 operating as a pull-down resistor and the output terminal DP. The drains of the output MOSFETs QP6 and QN6 are commonly connected and, although not limited, are connected to the output terminal DP via a resistor R9. The gates of the MOSFETs QP6 and QN6 are commonly connected and receive the input, data "data" (TxDP) via a pre-driver PDV. By providing a built-in resistor R4 like in FIG. 2 as a pull-up resistor in parallel with the P-channel MOSFET QP4, an excellent frequency characteristic is obtained and the operation, range is also widened. Similarly, also in the pull-down resistor, a resistor R7 is provided in parallel with the N-channel MOSFET QN4.

The output buffer replica circuit DOBR corresponding to the output buffer circuit DOB1 constructed as described above is provided. The P-channel MOSFET QP3 and the resistor R3 correspond to the MOSFETs QP4 and R4, and a P-channel MOSFET QP5 corresponds to the output MOSFET QP6. A resistor R5 is provided in correspondence with the resistor R9. The MOSFET QP5 is steadily in the on state by the supply of the ground potential Vss of the circuit to the gate. Current passed to the replica circuit is generated by the constant current source controlled with the control signal Irefn. Also in the output circuit for generating a low-level output signal, similarly, a P-channel MOSFET QN3 and a resistor R6 correspond to the MOSFET QN4 and the resistor R7, respectively, and an N-channel MOSFET QN5 corresponds to an output MOSFET QN6. The resistor R5 is provided in correspondence with the resistor R9. The MOSFET QN5 is steadily in the on state by the supply of the power supply voltage Vcc to the gate. Current passed to the replica circuit is generated by the constant current source controlled with the control signal Irefp.

The differential amplifier AMP2 in the control voltage generation circuit VCG receives, as a feedback voltage, a voltage at the connection point between the resistor R5 corresponding to the output terminal DP of the output buffer DOB1 and the current source, and generates the gate control voltage Vbp of the P-channel MOSFET QP3. As a result the general resistance characteristic of the P-channel MOSFET QP3, the resistor R3, the MOSFET QP5, and the resistor R5 in the replica circuit become the resistance characteristic corresponding to the reference voltage Vref' and the reference current Iref. By the control voltage Vbp, the MOSFET QP4 of the output buffer circuit DOB1 is controlled. Consequently, the output impedance Zbufp viewed from the output terminal DP has a resistance characteristic similar to that of the replica circuit.

The differential amplifier AMP3 of the control voltage generation circuit VCG receives, as a feedback voltage, a voltage at the connection point between the resistor R8 corresponding to the output terminal DP of the output buffer DOB1 and the current source, and generates the gate control voltage Vbn of the N-channel MOSFET QN3. As a result, the general resistance characteristic of the N-channel MOSFET QN3, the resistor R7, the MOSFET QN5, and the resistor R8 in the replica circuit become the resistance characteristic corresponding to the reference voltage Vref and the reference current Iref. By the control voltage Vbn, the MOSFET QN4 of the output buffer circuit DOB1 is controlled. Consequently, the output impedance Zbufm viewed from the output terminal DP also has a resistance characteristic similar to that of the replica circuit. The pull-down resistor uses the N-channel MOSFET QN4 and the source of the N-channel MOSFET QN4 is connected to the ground potential Vss of the circuit. Therefore, the reference voltage Vref using the ground potential Vss of the circuit as a reference can be used as it is without performing the voltage conversion.

The output buffer circuit DOB2 provided in correspondence with the other output terminal DM is constructed in a manner similar to the output buffer circuit DOB1. The control signals Vbp and Vbn are supplied to the output buffer circuit DOB2, and the output impedance has a resistance characteristic similar to that of the replica circuit.

In the full speed mode, the reference voltages Vref and Vref, the reference current Iref, and the gate control voltages Vbp and Vbn using the replica circuit are generated so that when the voltage of the output terminals DP and DM is 1.65V, the output current value corresponding to 45Ω (1.65V/45Ω=36.6 mA) is determined. The values of "Vcc−VREF'=1.65V" and the value of IREF of 36.6 mA are not limited. Any combination of the values may be used as long as a desired impedance characteristic of about 45Ω is obtained such as 2.0V and 44.4 mA. It is sufficient to select a combination capable of obtaining an excellent impedance characteristic. The size of the MOSFET in the replica circuit is smaller than that of the output buffer and is, for example, 1/50. In correspondence with the size ratio, the reference current Iref is set to 733 μA as 1/50. By supplying the control voltages Vbp and Vbn generated as described above to the output circuit of 50 times, the output current of 36.6 mA (=1.65V/45Ω) flows at the output terminals DP and DM.

Figure 8:
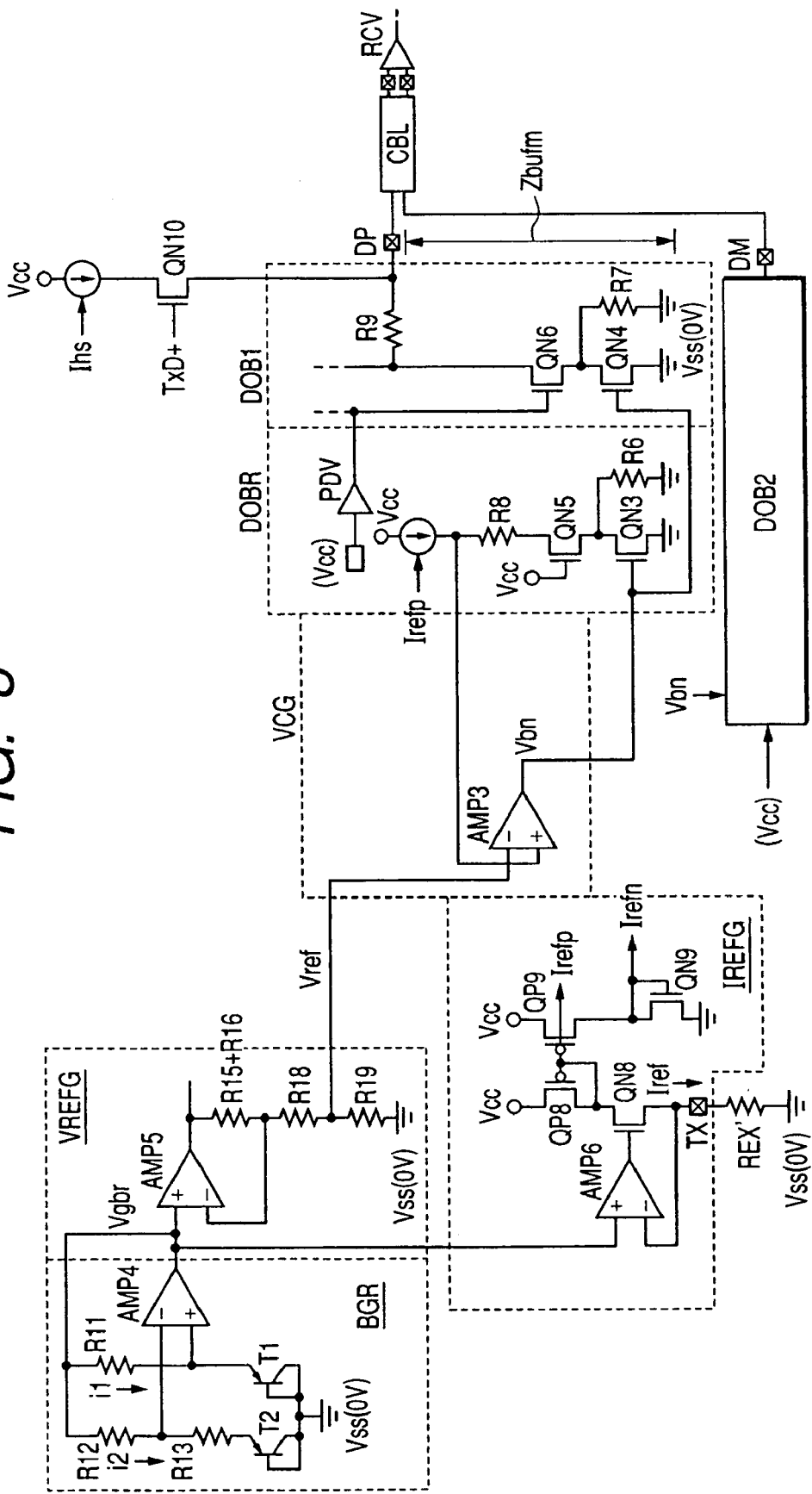
FIG. 8 is a concrete circuit diagram showing another example of the transmission circuit of FIG. 6.

FIG. 8 is a concrete circuit diagram showing another example of the transmission circuit of FIG. 6. The circuit diagram shows the output buffer circuit DOB1 as one of the circuits in a high speed mode in the USB 2.0 standard. The other output buffer circuit DOB2 is shown as a black box.

In the high speed mode, the output circuit on the low-level side operates as a termination resistor. Specifically, by using the power supply voltage Vcc as an input signal, the N-channel output MOSFET QP6 is steadily in the on state and the P-channel output MOSFET QP6 is steadily in the off state. As a result, the P-channel-side circuit performing high-level output operation is electrically isolated. Also in such a state, the control signal Vbn is generated by the MOSFETs QN6 and QN4, the resistor R7, the control voltage generation circuit VCG, and the replica circuit, and the output impedance Zbufm can be obtained.

In the high speed mode, driver current such as 17.7 mA is generated by a control signal His, and an output signal TxD+ is output via an N-channel output MOSFET QN10 having the gate to which the driver current is supplied. At this time, also in the reception-side LSI, the output circuit on the low-level side operates as a termination resistor. In such a high speed mode, high-speed data transfer of 480 Mbps or the like can be performed, so that writing to a CR-R and an access to an HDD at a speed exceeding 8× can be realized.

In the high speed mode, the reference voltages Vref and the reference current Iref are generated so that when the voltage of the output terminals DP and DM is 0.4V, the output current value corresponding to 45Ω is determined. The values of VREF and IREF of 0.4V are not limited as described above. Any combination of the values may be used as long as an excellent termination resistance characteristic of about 45Ω is obtained. When the MOSFET in the replica circuit is formed in a smaller size of, for example, 1/50 of the MOSFET of the output buffer circuit, the reference current Iref is also set 178 μA as 1/50. For such switching, for example, in the reference voltage generation circuit VREFG, a resistor R17 in FIG. 7 is constructed by resistors R18 and R19 shown in FIG. 8, the tap of the connection point of the resistors R18 and R19 is selected, and the reference voltage Vref such as 0.4V obtained by dividing the constant voltage Vgbr is generated. Although not shown, a plurality of current mirrors and switches are provided internally to switch the value of IREF.

The USB 2.0 standard includes a low speed mode (1.5 Mbps). In the low speed mode, the impedance of 45Ω is not specified. Consequently, any values may be set as the outputs Vbn and Vbp of the replica circuit in FIG. 6. A configuration may be employed such that Vbn and Vcc are set to the same value, Vbp is set as 0V, the output buffer in the full speed mode is used as it is as the output buffer in the low speed mode, and a pre-driver provided before the full speed output stage is disconnected by a switch and is replaced with a pre-driver in the low-speed.

Figure 9:
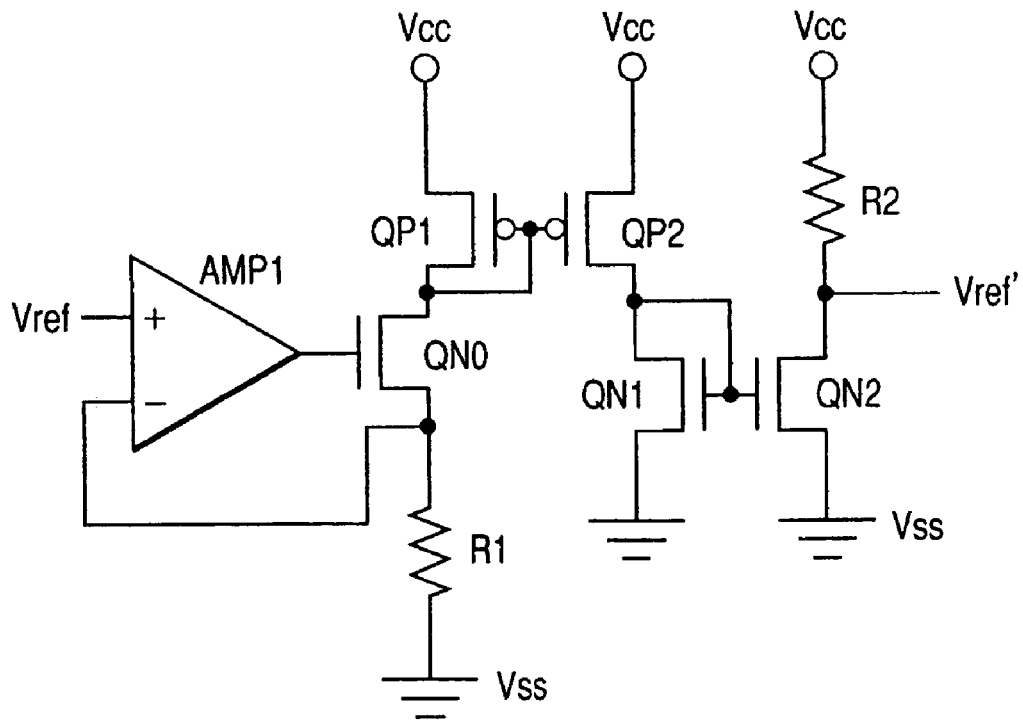
FIG. 9 is a circuit diagram showing another example of a voltage converting circuit provided for the semiconductor device according to the invention.

FIG. 9 is a circuit diagram showing another example of the voltage converting circuit provided for the semiconductor device according to the invention. The reference voltage Vref is supplied to the non-inversion input terminal (+) of the differential amplifier AMP1. The output voltage of the differential amplifier AMP1 is supplied to the gate of an N-channel MOSFET QN0. A resistor R1 is provided between the MOSFET QN0 and the ground potential point Vss (0V) of the circuit. The source voltage of the MOSFET QN0 is supplied to the inversion input terminal (−) of the differential amplifier AMP1. The differential amplifier AMP1 operates the MOSFET QN0 so that the potentials at the input terminals (+) and (−) become the same, so that the reference voltage Vref is applied to the resistor R1. Consequently, current such as Vref/R1 flows in the MOSFET QN0.

Between the drain of the N-channel MOSFET QN0 and the power supply voltage Vcc, a P-channel MOSFET QP1 whose gate and drain are connected to each other is provided. The MOSFET QP1 and a P-channel MOSFET QP2 are connected so as to form a current mirror. An N-channel MOSFET QN1 whose gate and drain are connected to each other is provided between the drain of the P-channel MOSFET QP2 and the ground potential point Vss (0V) of the circuit. The MOSFET QN1 and an N-channel MOSFET QN2 are connected so as to form a current mirror. A resistor R2 is provided between the drain of the MOSFET QN2 and the power supply voltage terminal Vcc. By making the sizes of the MOSFETs QP1 and QP2 and the MOSFETs QN1 and QN2 the same, the same current as that flowing in the N-channel MOSFET QN0 can be passed to the resistor R2. The resistors R1 and R2 are formed in the same manufacture process and disposed as close as possible. Although not limited, the resistors R1 and R2 are formed as polysilicon resistors and have the same resistance value.

The reference voltage Vref is a constant voltage using the ground potential (0V) of the circuit as a reference. When the MOSFETs QP1 and QP2 have the same size, the MOSFETs QN1 and QN2 have the same size, and the resistors R1 and R2 have the same resistance value, the constant voltage Vref' using the power supply voltage Vcc as a reference can be obtained from the resistor R2. That is, the current Vref/R1 flows in the resistor R1 via the MOSFETs QN0 and QP1, and the same current flows in the P-channel MOSFET QP2. The equal current flows in the resistor R2 via the current mirror (the MOSFETs QN1 and QN"). Therefore, by making the resistance value of the resistor R2 equal to the resistance value of the resistor R1, the equal current can be passed to the resistors R1 and R2. Thus, the voltage Vref applied to the resistor R1 becomes equal to the voltage Vref' generated by the resistor R2.

Figure 10:
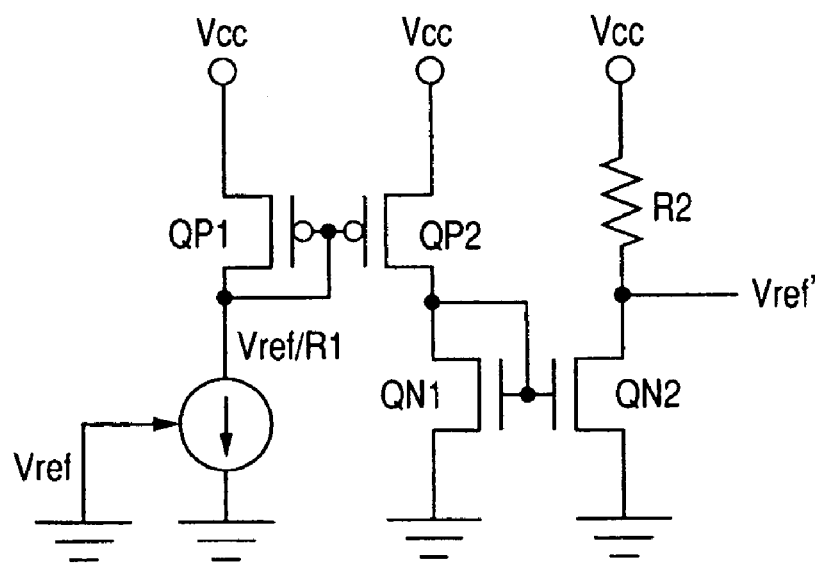
FIG. 10 is an equivalent circuit diagram of the voltage converting circuit of FIG. 9.

FIG. 10 is an equivalent circuit diagram of the voltage converting circuit of FIG. 9. The differential amplifier AMP1, the MOSFET QN0, and the resistor R1 can be regarded as a voltage-dependent current source corresponding to the reference voltage Vref and the resistor R1. By passing current generated by such a voltage-dependent current source to the resistor R2 provided on the power supply voltage Vcc side via the current mirror circuits (QP1 and QP2) and (QN1 and QN2), the reference voltage Vref corresponding to the ground potential of the circuit can be converted to the reference voltage Vref' corresponding to the power supply voltage Vcc.

Figure 11:
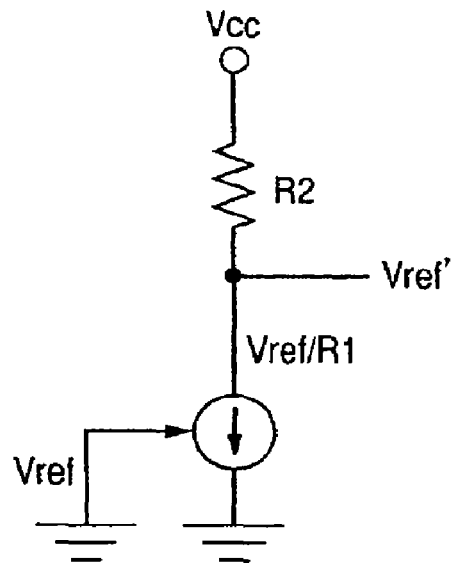
FIG. 11 is an equivalent circuit diagram of the voltage converting circuit of FIG. 9.
Figure 12:
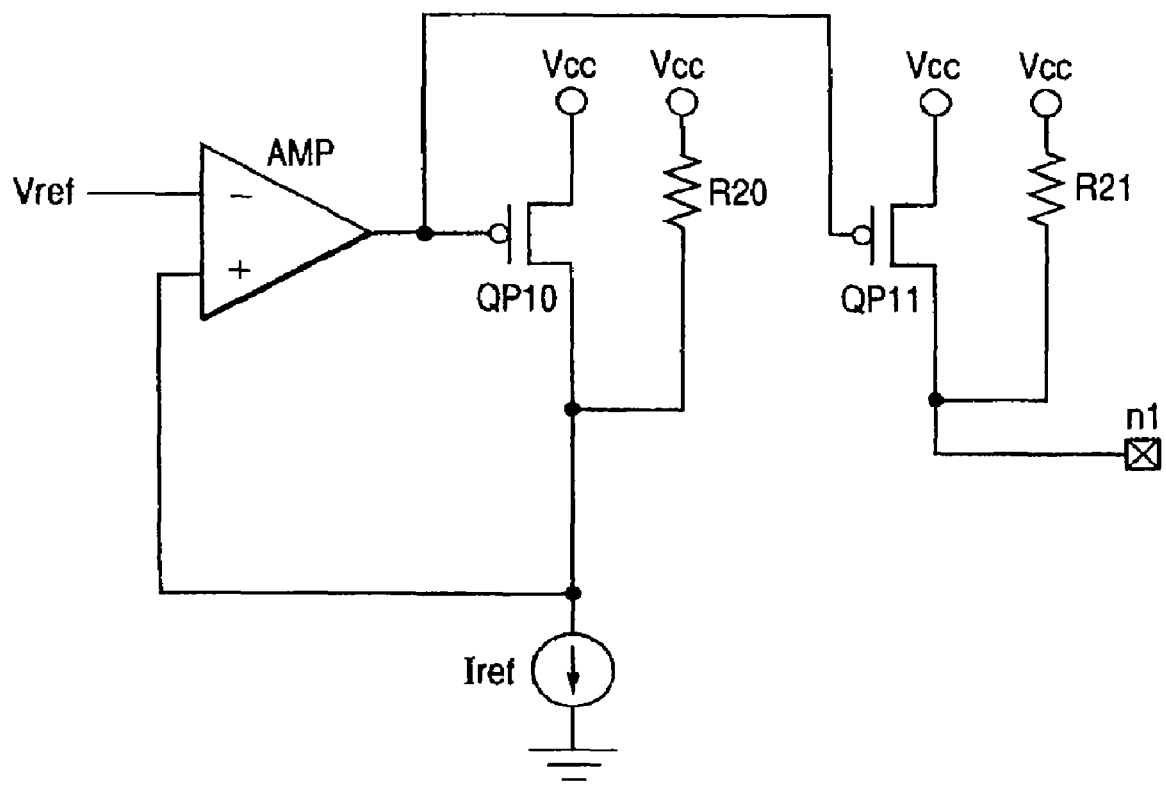
FIG. 12 is a circuit diagram showing a conventional pull-up resistor.

FIG. 11 is another equivalent circuit diagram of the voltage converting circuit of FIG. 9. The differential amplifier AMP1, the MOSFET QN0, and the resistor R1 can be regarded as a voltage-dependent current source corresponding to the reference voltage Vref and the resistor R1. By passing current generated by such a voltage-dependent current source directly to the resistor R2, the reference voltage Vref corresponding to the ground potential of the circuit can be converted to the reference voltage Vref' corresponding to the power supply voltage Vcc. In the case where the differential amplifier AMP and the N-channel MOSFET QN0 as shown in FIG. 9 are used, a drain voltage necessary for the operation of the MOSFET QN0 has to be assured. That is, the power supply voltage Vcc−Vref' has to be equal to or higher than the drain voltage necessary for the operation of the MOSFET QN0.

The present invention achieved by the inventors herein has been described concretely on the basis of the embodiments. However, the invention is not limited to the foregoing embodiments but can be variously modified without departing from the gist of the invention. For example, as the resistors R1 to R13 and the like in the semiconductor integrated circuit, polysilicon resistors or, to reduce the resistance value, silicide-deposited polysilicon resistors may be used. A polysilicon resistor on which metal silicide is not deposited may be also used. Further, resistors having frequency characteristics equivalent to the excellent frequency characteristic of the polysilicon resistor, and other resistors formed on a semiconductor board such as diffused resistors or well resistors can be also used. The present invention can be applied not only to the USB 2.0 but also to all of signal transmission/reception systems having a termination resistor in the semiconductor circuit. Since the resistance value of the built-in termination resistor can be controlled to an expectation value at high precision, the invention can be applied as a built-in constant resistor and can be applied to all of semiconductor LSIs having therein constant resistors. The invention can be applied to only one of a semiconductor device for transmitting signals and a semiconductor device for receiving signals.

The invention claimed is:

1. A semiconductor device comprising:
   a first circuit for generating a constant current on the basis of a reference voltage corresponding to a ground potential point of the circuit;
   a first resistive element whose one end is connected to a power supply voltage terminal, and to which the constant current generated by the first circuit is passed;
   a first differential amplifier having two input terminals to one of which a voltage generated by the first resistive element is supplied;
   a first MOSFET of a first conduction type whose source is connected to the power supply voltage terminal, and whose gate receives an output voltage of the first differential amplifier, the first MOSFET feeding back a drain voltage to the other input terminal of the first differential amplifier;
   a first current source provided between the drain of the first MOSFET and the ground potential point of the circuit, and setting a current to be passed to the first MOSFET; and
   a second MOSFET of the first conduction type whose source is connected to the power supply voltage terminal, and whose gate and the gate of the first MOSFET are commonly connected,
   wherein the second MOSFET is used as a resistive element whose resistance value is set in correspondence with the reference voltage and current of the first current source,
   wherein a positive power supply voltage is supplied to the power supply voltage terminal,
   wherein the first and second MOSFETs are P-channel MOSFETs,
   wherein the first circuit comprises a second differential amplifier, third and fourth P-channel-type MOSFETs, fifth and sixth N-channel-type MOSFETs, and a second resistive element,
   wherein the reference voltage is supplied to one of two input terminals of the second differential amplifier,
   wherein the sources of the third and fourth MOSFETs are connected to the power supply voltage terminal,
   wherein the sources of the fifth and sixth MOSFETs are connected to the ground potential point of the circuit,
   wherein the second resistive element is connected between the drain of the third MOSFET and the ground potential point of the circuit,
   wherein the other input terminal of the second differential amplifier is connected to the drain of the third MOSFET,
   wherein the gate and source of the fourth MOSFET are connected to the gate and source of the third MOSFET, respectively,
   wherein the gate and the drain of the fifth MOSFET are connected to each other,
   wherein the sixth MOSFET is connected to the fifth MOSFET so as to form a current mirror circuit,
   wherein the drain current of the fourth MOSFET is supplied to the drain of the fifth MOSFET, and
   wherein the drain current of the sixth MOSFET is used as the constant current.

2. The semiconductor device according to claim 1, wherein the first and second resistive elements are formed by the same manufacture process so as to be adjacent to each other over a semiconductor substrate.

3. The semiconductor device according to claim 2, wherein a third resistive element made of polysilicon is connected in parallel with the first MOSFET, and wherein a fourth resistive element made of polysilicon is connected in parallel with the second MOSFET.

4. The semiconductor device according to claim 2, wherein size of the first MOSFET is smaller than that of the second MOSFET at a predetermined ratio, and wherein the ratio of currents flowing in the first and second MOSFETs is set in correspondence with the predetermined ratio.

5. The semiconductor device according to claim 4, wherein a third resistive element made of polysilicon having a resistance ratio corresponding to the ratio of current is connected in parallel with the first MOSFET, and wherein a fourth resistive element made of polysilicon having a resistance ratio corresponding to the ratio of current is connected in parallel with the second MOSFET.

6. The semiconductor device according to claim 2, further comprising:
   a third differential amplifier having two input terminals to one of which the reference voltage is supplied;
   an eighth MOSFET of an N-channel type whose source is connected to the ground potential point of the circuit, and whose gate receives an output voltage of the third differential amplifier, the eighth MOSFET feeding back a drain voltage to the other input terminal of the third differential amplifier;
   a second current source provided between the drain of the eighth MOSFET and the power supply voltage terminal, and setting a current to be passed to the eighth MOSFET; and
   a ninth MOSFET of the N-channel type whose source is connected to the ground potential point of the circuit, and whose gate and the gate of the eighth MOSFET are commonly connected,
   wherein the second MOSFET is used as a pull-up resistive element, and
   wherein the ninth MOSFET is used as a pull-down resistive element whose resistance value is set in correspondence with the reference voltage and current of the second current source.

7. The semiconductor device according to claim 6, wherein a P-channel type output MOSFET for generating a high-level output signal is connected in series between the second MOSFET and a first output terminal,
   wherein an N-channel type output MOSFET for generating a low-level output signal is connected in series between the ninth MOSFET and the first output terminal,
   wherein a dummy MOSFET of a P-channel type having a gate to which the ground potential of the circuit is supplied and corresponding to the P-channel output MOSFET is provided between the first MOSFET and the first current source,
   wherein a dummy MOSFET of an N-channel type having a gate to which the power supply voltage is supplied and corresponding to the N-channel output MOSFET is provided between the eighth MOSFET and the second current source, and
   wherein transmission data is supplied to the gates of the P-channel output MOSFET and the N-channel output MOSFET.

8. The semiconductor device according to claim 7, wherein size of the first MOSFET is smaller than that of the second MOSFET at a predetermined ratio,
   wherein size of the eighth MOSFET is smaller than that of the ninth MOSFET at a predetermined ratio, and
   wherein the ratio of currents flowing in the first and second MOSFETs and the eighth and ninth MOSFETs is set in correspondence with the predetermined ratio.

9. The semiconductor device according to claim 8,
wherein a third resistive element made of polysilicon having a resistance ratio corresponding to the ratio of current is connected in parallel with the first MOSFET,
wherein a fourth resistive element made of polysilicon having a resistance ratio corresponding to the ratio of current is connected in parallel with the second MOSFET,
wherein a fifth resistive element made of polysilicon having a resistance ratio corresponding to the ratio of current is connected in parallel with the eighth MOSFET, and
wherein a sixth resistive element made of polysilicon having a resistance ratio corresponding to the ratio of current is connected in parallel with the ninth MOSFET.

10. The semiconductor device according to claim 9,
wherein a circuit for outputting an output signal from the first output terminal is used as a first output circuit,
wherein the semiconductor device further comprises a second output terminal and a second output circuit for outputting, from the second output terminal, an output signal having a phase opposite to that of the output signal output from the first output terminal, and
wherein the second output circuit comprises circuit elements corresponding to the second MOSFET, the ninth MOSFET, the P-channel output MOSFET, the N-channel output MOSFET, and the third, fourth, fifth, and sixth polysilicon resistive elements.

11. The semiconductor device according to claim 10, wherein the first and second output circuits output signals in a full speed mode of USB 2.0.

12. The semiconductor device according to claim 11,
wherein the first and second output terminals are further provided with third and fourth output circuits performing output operation corresponding to a high speed mode of USB 2.0,
wherein, in outputting operation in the full speed mode, the third and fourth output circuits are electrically isolated from the first and second output terminals, respectively,
wherein, in outputting operation in the high speed mode, the third and fourth output circuits are electrically connected to the first and second output terminals, respectively, and
wherein, in the outputting operation in the high speed mode, both of input signals of the first and second output circuits are set to the high level, and the first and second output circuits operate as transmission-side resistive elements connected to the third and fourth output circuits.

13. The semiconductor device according to claim 12,
wherein, in receiving operation in the full speed mode, the first and second output terminals are used as first and second input terminals, and the first to fourth output circuits enter an output high-impedance state, and
wherein, in receiving operation in the high speed mode, the first and second output terminals are used as first and second input terminals, the third and fourth output circuits enter an output high-impedance state, both of input signals of the first and second output circuits are set to the high level, and the first and second output circuits operate as reception-side resistive elements.

14. A semiconductor device comprising:
a first circuit for generating a constant current on the basis of a reference voltage corresponding to a ground potential point of the circuit;
a first resistive element whose one end is connected to a power supply voltage terminal, and to which the constant current generated by the first circuit is passed;
a first differential amplifier having two input terminals to one of which a voltage generated by the first resistive element is supplied;
a first MOSFET of a first conduction type whose source is connected to the power supply voltage terminal, and whose gate receives an output voltage of the first differential amplifier, the first MOSFET feeding back a drain voltage to the other input terminal of the first differential amplifier;
a first current source provided between the drain of the first MOSFET and the ground potential point of the circuit, and setting a current to be passed to the first MOSFET; and
a second MOSFET of the first conduction type whose source is connected to the power supply voltage terminal, and whose gate and the gate of the first MOSFET are commonly connected,
wherein the second MOSFET is used as a resistive element whose resistance value is set in correspondence with the reference voltage and current of the first current source,
wherein a positive power supply voltage is supplied to the power supply voltage terminal,
wherein the first and second MOSFETs are P-channel MOSFETs,
wherein the first circuit comprises a second differential amplifier, third and fourth P-channel-type MOSFETs, fifth to seventh N-channel-type MOSFETs, and a second resistive element,
wherein the reference voltage is supplied to one of two input terminals of the second differential amplifier,
wherein the sources of the third and fourth MOSFETs are connected to the power supply voltage terminal,
wherein the sources of the fifth and sixth MOSFETs are connected to the ground potential point of the circuit,
wherein the drain of the seventh MOSFET is connected to the drain of the third MOSFET, the second resistive element is connected between the source of the seventh MOSFET and the ground potential point of the circuit,
wherein the other input terminal of the second differential amplifier is connected to the source of the seventh MOSFET,
wherein the gate and source of the third MOSFET are connected to each other,
wherein the fourth MOSFET is connected to the third MOSFET so as to form a current mirror circuit,
wherein the gate and the drain of the fifth MOSFET are connected to each other,
wherein the sixth MOSFET is connected to the fifth MOSFET so as to form a current mirror circuit,
wherein the drain current of the fourth MOSFET is supplied to the drain of the fifth MOSFET, and
wherein the drain current of the sixth MOSFET is used as the constant current.

15. The semiconductor device according to claim 14, wherein the first and second resistive elements are formed by the same manufacture process so as to be adjacent to each other over a semiconductor substrate.

16. The semiconductor device according to claim 15,
wherein a third resistive element made of polysilicon is connected in parallel with the first MOSFET, and
wherein a fourth resistive element made of polysilicon is connected in parallel with the second MOSFET.

17. The semiconductor device according to claim 15,
wherein size of the first MOSFET is smaller than that of the second MOSFET at a predetermined ratio, and wherein the ratio of currents flowing in the first and second MOSFETs is set in correspondence with the predetermined ratio.

18. The semiconductor device according to claim 17, wherein a third resistive element made of polysilicon having a resistance ratio corresponding to the ratio of current is connected in parallel with the first MOSFET, and
wherein a fourth resistive element made of polysilicon having a resistance ratio corresponding to the ratio of current is connected in parallel with the second MOSFET.

19. The semiconductor device according to claim 15, further comprising:
a third differential amplifier having two input terminals to one of which the reference voltage is supplied;
an eighth MOSFET of an N-channel type whose source is connected to the ground potential point of the circuit, and whose gate receives an output voltage of the third differential amplifier, the eighth MOSFET feeding back a drain voltage to the other input terminal of the third differential amplifier;
a second current source provided between the drain of the eighth MOSFET and the power supply voltage terminal, and setting a current to be passed to the eighth MOSFET; and
a ninth MOSFET of the N-channel type whose source is connected to the ground potential point of the circuit, and whose gate and the gate of the eighth MOSFET are commonly connected,
wherein the second MOSFET is used as a pull-up resistive element, and
wherein the ninth MOSFET is used as a pull-down resistive element whose resistance value is set in correspondence with the reference voltage and current of the second current source.

20. The semiconductor device according to claim 19, wherein a P-channel type output MOSFET for generating a high-level output signal is connected in series between the second MOSFET and a first output terminal,
wherein an N-channel type output MOSFET for generating a low-level output signal is connected in series between the ninth MOSFET and the first output terminal,
wherein a dummy MOSFET of a P-channel type having a gate to which the ground potential of the circuit is supplied and corresponding to the P-channel output MOSFET is provided between the first MOSFET and the first current source,
wherein a dummy MOSFET of an N-channel type having a gate to which the power supply voltage is supplied and corresponding to the N-channel output MOSFET is provided between the eighth MOSFET and the second current source, and
wherein transmission data is supplied to the gates of the P-channel output MOSFET and the N-channel output MOSFET.

21. The semiconductor device according to claim 20, wherein size of the first MOSFET is smaller than that of the second MOSFET at a predetermined ratio,
wherein size of the eighth MOSFET is smaller than that of the ninth MOSFET at a predetermined ratio, and
wherein the ratio of currents flowing in the first and second MOSFETs and the eighth and ninth MOSFETs is set in correspondence with the predetermined ratio.

22. The semiconductor device according to claim 21, wherein a third resistive element made of polysilicon having a resistance ratio corresponding to the ratio of current is connected in parallel with the first MOSFET,
wherein a fourth resistive element made of polysilicon having a resistance ratio corresponding to the ratio of current is connected in parallel with the second MOSFET,
wherein a fifth resistive element made of polysilicon having a resistance ratio corresponding to the ratio of current is connected in parallel with the eighth MOSFET, and
wherein a sixth resistive element made of polysilicon having a resistance ratio corresponding to the ratio of current is connected in parallel with the ninth MOSFET.

23. The semiconductor device according to claim 22, wherein a circuit for outputting an output signal from the first output terminal is used as a first output circuit,
wherein the semiconductor device further comprises a second output terminal and a second output circuit for outputting, from the second output terminal, an output signal having a phase opposite to that of the output signal output from the first output terminal, and
wherein the second output circuit comprises circuit elements corresponding to the second MOSFET, the ninth MOSFET, the P-channel output MOSFET, the N-channel output MOSFET, and the third, fourth, fifth, and sixth polysilicon resistive elements.

24. The semiconductor device according to claim 23, wherein the first and second output circuits output signals in a full speed mode of USB 2.0.

25. The semiconductor device according to claim 24, wherein the first and second output terminals are further provided with third and fourth output circuits performing output operation corresponding to a high speed mode of USB 2.0,
wherein, in outputting operation in the full speed mode, the third and fourth output circuits are electrically isolated from the first and second output terminals, respectively,
wherein, in outputting operation in the high speed mode, the third and fourth output circuits are electrically connected to the first and second output terminals, respectively, and
wherein, in the outputting operation in the high speed mode, both of input signals of the first and second output circuits are set to the high level, and the first and second output circuits operate as transmission-side resistive elements connected to the third and fourth output circuits.

26. The semiconductor device according to claim 25, wherein, in receiving operation in the full speed mode, the first and second output terminals are used as first and second input terminals, and the first to fourth output circuits enter an output high-impedance state, and
wherein, in receiving operation in the high speed mode, the first and second output terminals are used as first and second input terminals, the third and fourth output circuits enter an output high-impedance state, both of input signals of the first and second output circuits are set to the high level, and the first and second output circuits operate as reception-side resistive elements.

* * * * *